United States Patent
Hall et al.

(10) Patent No.: US 9,711,711 B2
(45) Date of Patent: Jul. 18, 2017

(54) PIECEWISE PIEZOELECTRIC ENERGY HARVESTER

(71) Applicant: TEXAS INSTRUMENTS INCORPORATED, Dallas, TX (US)

(72) Inventors: James Hall, Parker, TX (US); Jianbai Jenn Wang, Mountain View, CA (US); Cuiling Gong, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 579 days.

(21) Appl. No.: 14/323,996

(22) Filed: Jul. 3, 2014

(65) Prior Publication Data

US 2015/0015114 A1 Jan. 15, 2015

Related U.S. Application Data

(60) Provisional application No. 61/842,875, filed on Jul. 3, 2013.

(51) Int. Cl.

| | |
|---|---|
| *H01L 41/113* | (2006.01) |
| *H01L 41/332* | (2013.01) |
| *H02N 2/00* | (2006.01) |
| *H02N 2/18* | (2006.01) |

(52) U.S. Cl.
CPC .......... *H01L 41/332* (2013.01); *H01L 41/113* (2013.01); *H01L 41/1136* (2013.01); *H02N 2/181* (2013.01); *H02N 2/188* (2013.01); *H02N 2/22* (2013.01); *Y10T 29/42* (2015.01)

(58) Field of Classification Search
CPC .......... H02N 2/18; H02N 2/186; H02N 2/188; H01L 41/113; H01L 41/1136
See application file for complete search history.

(56) References Cited

U.S. PATENT DOCUMENTS

| 5,020,370 A | * | 6/1991 | Deval | G01P 15/097 310/321 |
|---|---|---|---|---|
| 2008/0042518 A1 | * | 2/2008 | Liu | H01H 59/0009 310/319 |
| 2009/0211353 A1 | * | 8/2009 | Gao | B60C 23/0411 73/146.5 |
| 2010/0064813 A1 | * | 3/2010 | Nishizawa | G01P 15/097 73/651 |
| 2014/0183669 A1 | * | 7/2014 | Xu | G01C 19/5656 257/415 |

* cited by examiner

*Primary Examiner* — Thomas Dougherty
(74) *Attorney, Agent, or Firm* — Michael A. Davis, Jr.; Charles A. Brill; Frank D. Cimino

(57) ABSTRACT

A piezoelectric energy harvester device has a cantilevered structure with a rectangular proof mass portion defined by holes through a substrate along three sides of a proof mass portion and supported by a thinned hinge portion for free pivotal movement relative to an anchor portion. Elongated strips of piezoelectric energy harvesting units are formed in side-by-side spaced positions on the hinge portion and aligned parallel or perpendicular to a stress direction. Multiplexing electronics coupled to contact pads on the anchor portion selectively connects different strip combinations to power management circuitry, responsive to variations in vibration magnitude or modes.

12 Claims, 5 Drawing Sheets

PIECEWISE PIEZOELECTRIC ENERGY HARVESTER

This application claims the benefit of Provisional Application No. 61/842,875, filed Jul. 3, 2013, the entirety of which is hereby incorporated by reference.

BACKGROUND

Piezoelectric material is commonly used in vibration energy harvesting devices. To gain an optimal power or voltage output, piezoelectric material is usually applied on top of a mechanical vibration structure where the stress is most concentrated. Most of the state-of-the-art piezoelectric harvesters use one piece continuous piezoelectric material to serve this purpose. However, as the vibration intensity and modes vary, the stress-concentrated area can vary in location and size. Since the piezoelectric material layout cannot be adjusted accordingly, the harvester efficiency and power output will be compromised when the vibration deviates from the design target.

SUMMARY

To address this problem, piecewise piezoelectric energy harvesting units are used to cover potential stress-concentrated regions on a mechanical vibrator. And the pieces to be used for energy harvesting are selected based on characteristics of the vibration.

In an example embodiment, a piezoelectric energy harvester device has a rectangular substrate comprising a cantilevered structure with a rectangular proof mass portion defined by holes through the substrate along three sides of the proof mass portion and supported for free pivotal movement relative to a rectangular anchor portion by a hinge portion. The hinge portion is defined by a thinned portion of the substrate along a fourth side of the proof mass portion at a juncture of the proof mass portion with the anchor portion. Elongated strips of piezoelectric energy harvesting units are formed in side-by-side spaced positions on the hinge portion, the elongated strips being aligned parallel to or perpendicular to a stress direction of the free pivotal movement. Contact pads are formed on the substrate in spaced positions along sides of the anchor portion, and lead lines are formed on the substrate respectively joining ends of the elongated strips with corresponding different ones of the contact pads. In specific implementations, the elongated strips are aligned parallel to or perpendicular to the juncture. The substrate may be a semiconductor substrate and the contact pads and lead lines may be one or more layers of conductive material deposited on the substrate and patterned. The semiconductor substrate may be a silicon wafer that has been etched through along the three sides of the proof mass portion and thinned down by etching along the fourth side of the proof mass portion. The elongated strips of piezoelectric energy harvesting units comprise one or more patterned layers of piezoelectric material deposited on the substrate.

The energy harvester device may be used with power management circuitry configured for providing a generated voltage within a given voltage range. Multiplexing electronics coupled to the contact pads and to the power management circuitry may be used for selectively connecting different combinations of the elongated strips as inputs to the power management circuitry, responsive to variations in vibration magnitude or modes of the piezoelectric energy harvester device.

DETAILED DESCRIPTION OF EXAMPLE EMBODIMENTS

Figure 1A:
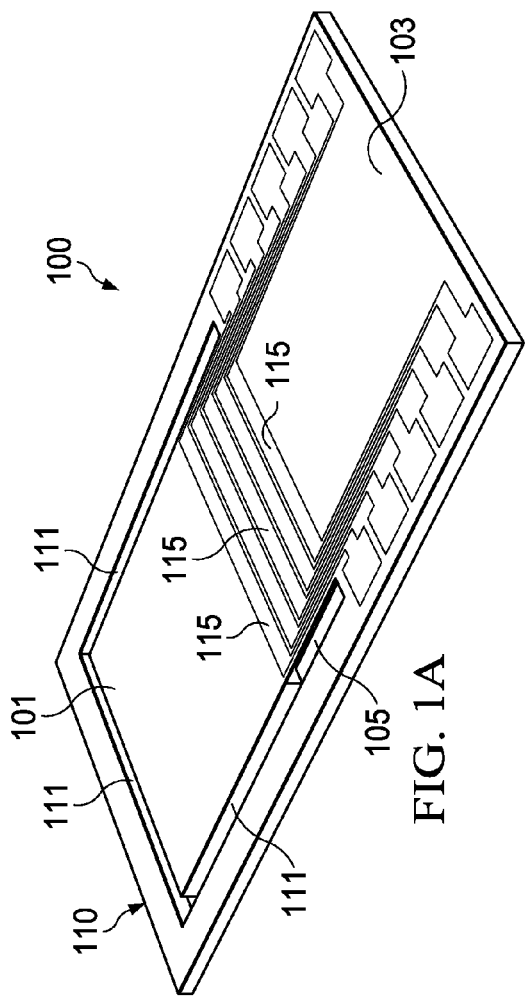
FIGS. 1A and 1B are perspective views of energy harvesting device embodiments.
Figure 1B:
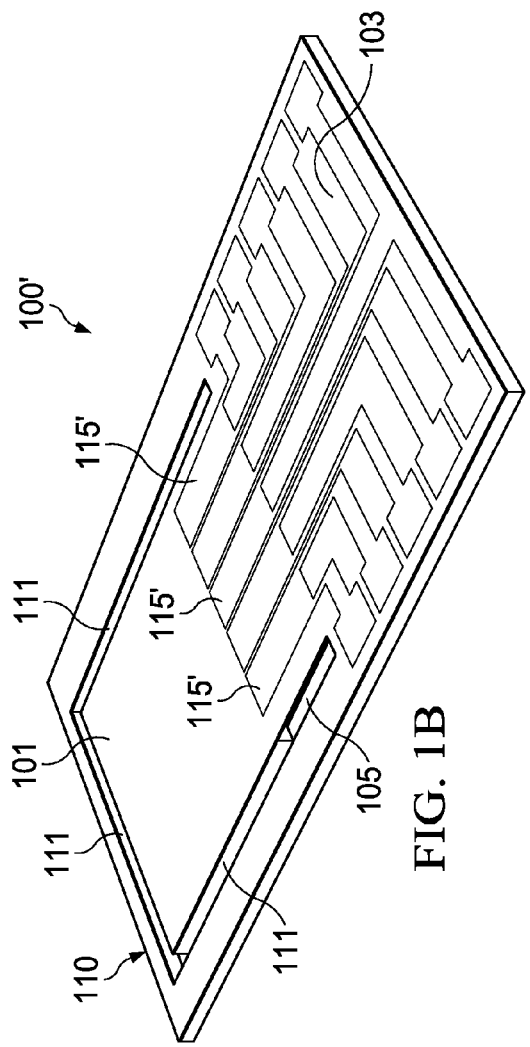

FIGS. 1A and 1B illustrate example cantilever energy harvesting structures 100, 100' having proof mass portions 101 supported for free pivotal movement relative to anchor portions 103 on hinges 105. The structures may be formed by patterning a substrate 110, with the proof mass 101 defined by through etches 111 on three sides and a thinned hinge portion 105 on a fourth side. Strips of piezoelectric (PZE) energy harvesting units 115, 115' may be formed over the hinge portion 105 in side-by-side spaced apart positions, running either parallel to or perpendicular to the stress direction (see FIG. 4). FIG. 1A shows the PZE units 115 aligned parallel to the hinge juncture 105 with the anchor 103. FIG. 1B shows the PZE units 115' aligned perpendicular to the hinge juncture 105 with the anchor 103.

Figure 2A:
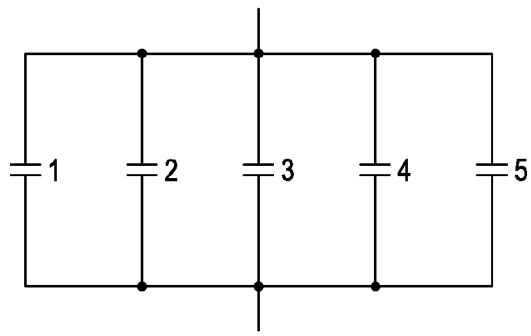
FIGS. 2A and 2B show parallel and serial arrangements of energy harvesting units of the devices of FIGS. 1A and 1B.
Figure 2B:
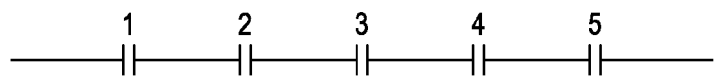
Figure 5:
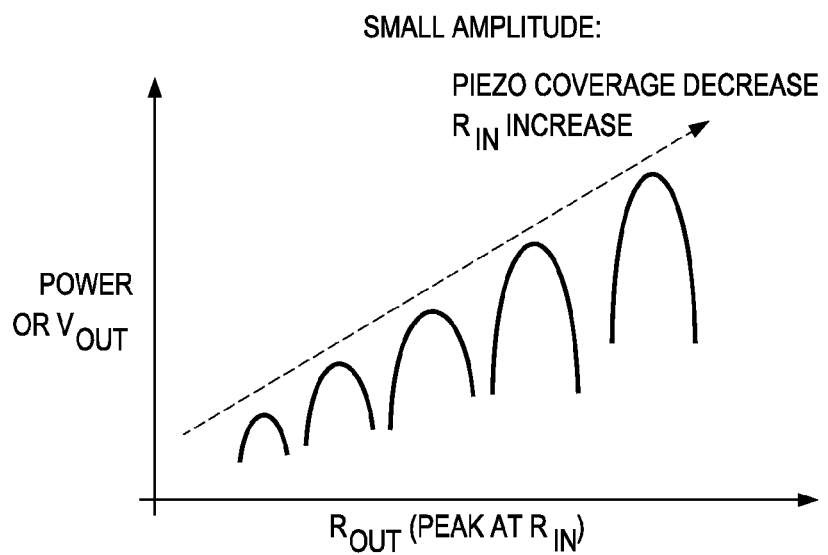
FIG. 5 is a graph of power/voltage output as a function of resistance.
Figure 3:
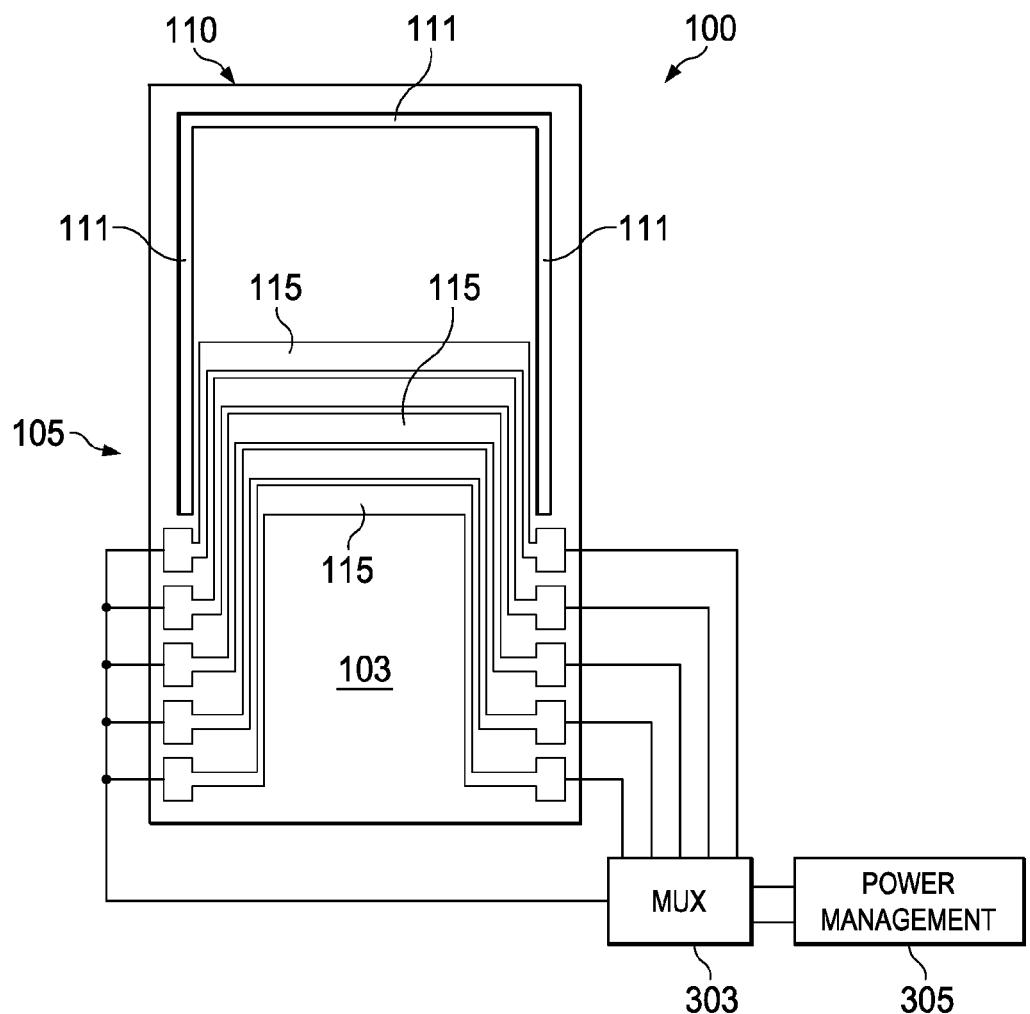
FIG. 3 illustrates a system having a multiplexing electronics interface between the energy harvesting device of FIG. 1A and power management circuitry.
Figure 4:
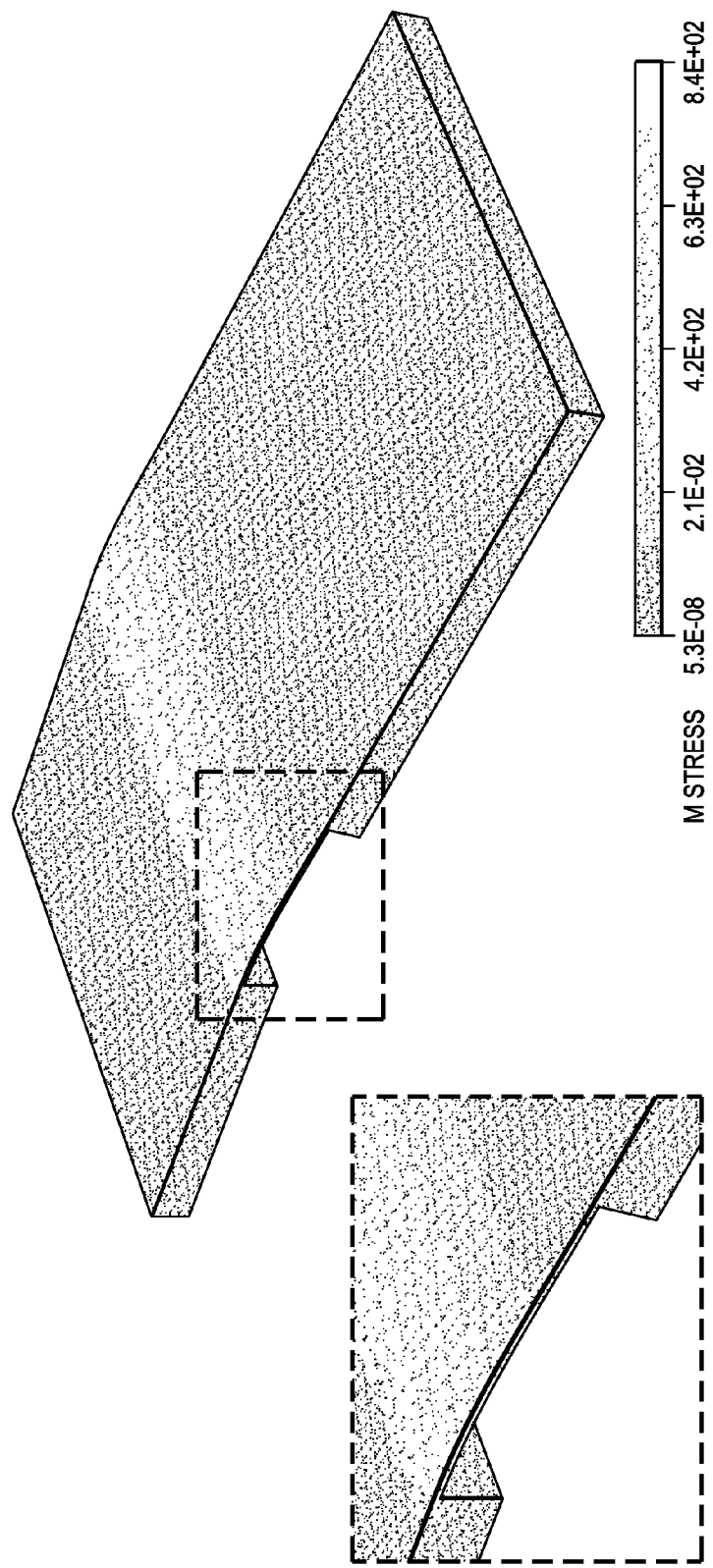
FIG. 4 is a set of perspective views of stress direction in cantilever energy harvesting structures of FIGS. 1A and 1B.
Figure 6:
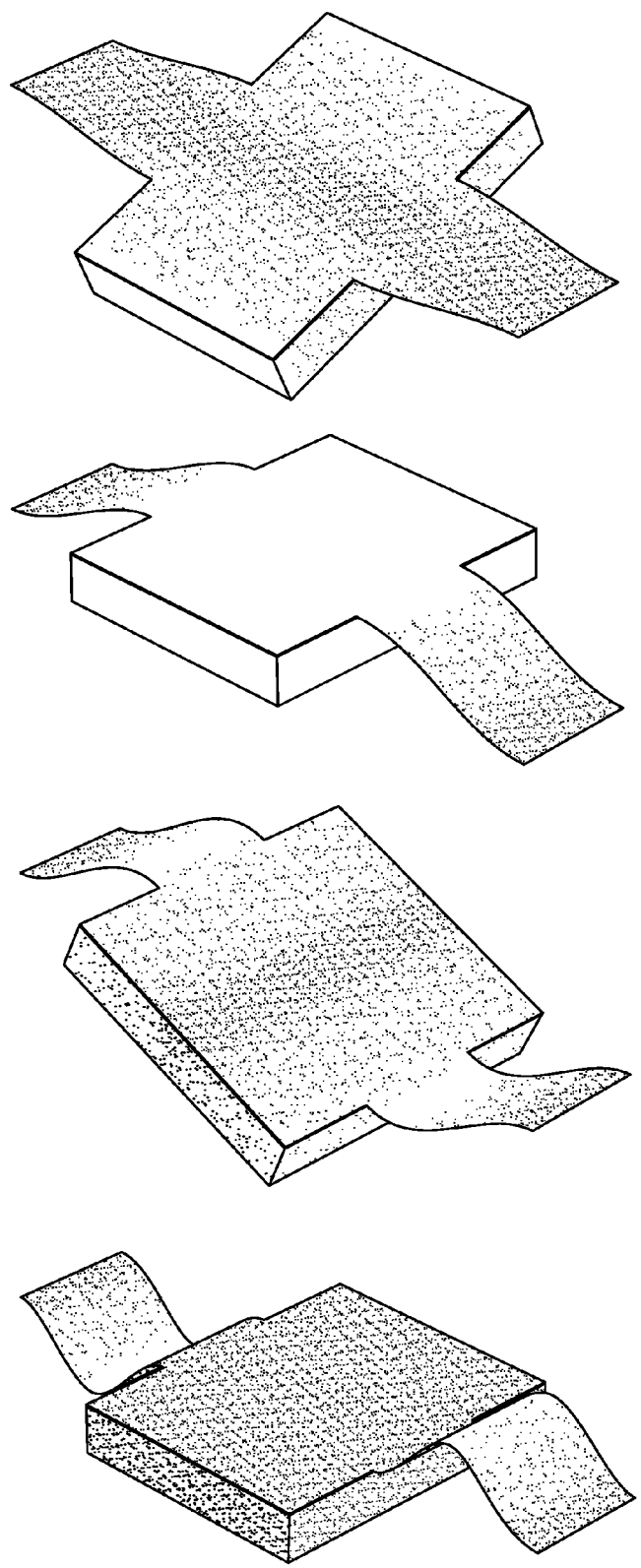
FIG. 6 is a set of perspective views of example stressed areas in the cantilever energy harvesting structures of FIGS. 1A and 1B, corresponding to four different vibration modes.

In the illustrated embodiments, five piezoelectric units 115, 115' are used to cover the flexible beam area of the hinge 105 in the cantilevered structure. These five units can be either arranged in parallel for low internal resistance or in series for a high output voltage as schematically illustrated in FIGS. 2A and 2B. With a weak vibration, the stress-induced charge is only generated on the units or portions of units closest to the anchor. The five parallel harvesting units average the charge and output a low voltage, while the serial units close to the proof mass do not contribute to the output voltage at all. As a result, the multiplexing electronics will program the harvesting units to eliminate the non-contributing units and ensure optimal power/voltage outputs. FIG. 3 illustrates a system 300 having a multiplexing electronics 303 interface ("MUX") between the energy harvesting device 100 and the power management circuitry 305. Switching circuitry within the multiplexing electronics 303 is programmed to connect different combinations of the units 115 to the power management circuitry 305 responsive to different vibration modes and/or magnitudes. FIGS. 4, 5 and 6 show that programmability enhances the power/voltage output for the parallel harvesting units laid on the cantilever hinge.

The piezoelectric units can also be arranged in serial along the stress direction. Based on the voltage output of each unit, the multiplexing electronics can determine how many units to turn on so that the voltage will fall in the range that the power management circuitry is designed especially for the high voltage output harvesters.

Similarly, in a structure having multiple modes of vibrations (FIG. 6), various piezoelectric harvesting units can be arranged at the most stressed areas corresponding to different vibration modes. The output power/voltage can be optimized upon the mode frequencies.

Existing methods in literature include material property optimization, alternative piezoelectric mode (d33) and power management to optimize the output voltage/power. Both material property and piezoelectric mode d33 are fixed parameters during operation and do not vary as vibration magnitude and mode changes. Power management can adjust accordingly based on input signal, but does not fundamentally change the input signal. While the piecewise piezoelectric units can be programmed to optimize power/voltage output when external vibration magnitude or modes varies.

Whether the original configuration is parallel or serial, the multiple outputs may be first connected through off-chip multiplexing electronics before they are processed with the usual power management circuit. Ideally, the different combination of harvesting units can be assessed till the optimal output power/voltage is achieved.

For stress-induced charges Q in the PZE harvester, generated voltage may be defined as: $V_{OUT}=Q/C$. With internal resistance=Zin ("$R_{IN}$") and load resistance=Zout ("$R_{OUT}$"), maximum power output Pmax occurs at Zout=Zin (see FIG. 5).

With the parallel harvester unit arrangement 100 shown in FIG. 1A, at large vibration amplitude, the stress and induced charges cover the entire harvester area. Maximized Q with a large A ensures high power and voltage outputs. At small vibration amplitude, the stress and induced charges are concentrated in the area close to the anchor. However, the charge has to be averaged over a large harvester area. As a result the output power and voltage will be degraded. By providing programmability, an optimal power output may be provided.

With multi-mode harvesting (first four modes: 475 Hz, 601.6 Hz, 1.73 kHz, 2.67 kHz), as illustrated in FIG. 6, PZE energy harvester units are placed at stressed areas to collect energy generated due to mode variation at different frequencies.

Those skilled in the art will appreciate that modifications may be made to the described embodiments and that other embodiments are possible within the scope of the claimed invention.

What is claimed is:

1. A piezoelectric energy harvester device, comprising:
a rectangular substrate comprising a cantilevered structure having a rectangular proof mass portion defined by holes through the substrate along three sides of the proof mass portion and supported for free pivotal movement relative to a rectangular anchor portion by a hinge portion defined by a thinned portion of the substrate along a fourth side of the proof mass portion at a juncture of the proof mass portion with the anchor portion;
elongated strips of piezoelectric energy harvesting units formed in side-by-side spaced positions on the hinge portion, the elongated strips being aligned parallel to or perpendicular to a stress direction of the free pivotal movement;
contact pads formed on the substrate in spaced positions along sides of the anchor portion; and
lead lines formed on the substrate respectively connecting the elongated strips with the contact pads.

2. The device of claim 1, wherein the elongated strips are aligned parallel to the juncture.

3. The device of claim 1, wherein the elongated strips are aligned perpendicular to the juncture.

4. The device of claim 1, wherein the substrate comprising a semiconductor substrate and the contact pads and lead lines comprise one or more patterned layers of conductive material deposited on the substrate.

5. The device of claim 4, wherein the semiconductor substrate is a silicon wafer that has been etched through along the three sides of the proof mass portion and thinned down by etching along the fourth side of the proof mass portion.

6. The device of claim 5, wherein the elongated strips of piezoelectric energy harvesting units comprise one or more patterned layers of piezoelectric material deposited on the substrate.

7. A piezoelectric energy harvester, comprising:
a piezoelectric energy harvester device including:
a rectangular substrate comprising a cantilevered structure having a rectangular proof mass portion defined by holes through the substrate along three sides of the proof mass portion and supported for free pivotal movement relative to a rectangular anchor portion by a hinge portion defined by a thinned portion of the substrate along a fourth side of the proof mass portion at a juncture of the proof mass portion with the anchor portion;
elongated strips of piezoelectric energy harvesting units formed in side-by-side spaced positions on the hinge portion, the elongated strips being aligned parallel to or perpendicular to a stress direction of the free pivotal movement;
contact pads formed on the substrate in spaced positions along sides of the anchor portion; and
lead lines formed on the substrate respectively joining the elongated strips to the contact pads;
power management circuitry configured for providing a generated voltage within a given voltage range; and
multiplexing electronics coupled to the contact pads and to the power management circuitry for selectively connecting different combinations of the elongated strips to the power management circuitry responsive to variations in vibration magnitude or modes.

8. A method for making a piezoelectric energy harvester device, comprising:
patterning a rectangular die area of a semiconductor wafer substrate to form a cantilevered structure having a rectangular proof mass portion supported by a hinge portion for free pivotal movement relative to an anchor portion, including etching openings through the substrate to define three sides of the proof mass portion and etching to thin the substrate to define the hinge portion along a fourth side of the proof mass portion at a juncture of the proof mass portion with the anchor portion;
forming elongated strips of piezoelectric energy harvesting units in side-by-side spaced positions on the hinge portion, the elongated strips being formed in parallel or perpendicular alignment to a stress direction of the free pivotal movement;
forming contact pads on the rectangular die area in spaced positions along sides of the anchor portion; and
forming lead lines on the substrate respectively joining the elongated strips with the contact pads.

9. The method of claim 8, wherein the elongated strips are formed parallel to the juncture.

10. The method of claim 8, wherein the elongated strips are formed perpendicular to the juncture.

11. The method of claim 8, wherein the contact pads and lead lines are formed by depositing and patterning one or more layers of conductive material.

12. The device of claim 11, wherein the elongated strips of piezoelectric energy harvesting units are formed by depositing and patterning one or more layers of piezoelectric material.

\* \* \* \* \*